United States Patent [19]
Uemura

[11] Patent Number: 6,016,003
[45] Date of Patent: Jan. 18, 2000

[54] CHIP-LEAD INTERCONNECTION STRUCTURE IN A SEMICONDUCTOR DEVICE

[75] Inventor: Hideaki Uemura, Kanagawa, Japan

[73] Assignee: NEC Corporation, Tokyo, Japan

[21] Appl. No.: 08/960,217

[22] Filed: Oct. 29, 1997

[30] Foreign Application Priority Data

Oct. 29, 1996 [JP] Japan ................................ 8-286565

[51] Int. Cl.[7] ................................................ H01L 23/495
[52] U.S. Cl. ........................... 257/666; 257/670; 257/676
[58] Field of Search .................................. 257/666, 670, 257/676

[56] References Cited

U.S. PATENT DOCUMENTS

| 4,943,843 | 7/1990 | Okinaga et al. . |
| 5,287,000 | 2/1994 | Takahashi et al. . |
| 5,545,920 | 8/1996 | Russell .................................... 257/666 |
| 5,717,246 | 2/1998 | Brooks et al. ........................... 257/666 |

FOREIGN PATENT DOCUMENTS

| 61-218139 | 9/1986 | Japan . |
| 4-316338 | 11/1992 | Japan . |
| 4-372161 | 12/1992 | Japan . |
| 521694 | 1/1993 | Japan . |
| 5-183090 | 7/1993 | Japan . |
| 5-291478 | 11/1993 | Japan . |
| 5291478 | 11/1993 | Japan . |
| 6-232328 | 8/1994 | Japan . |
| 7-94658 | 4/1995 | Japan . |

Primary Examiner—Donald L. Monin, Jr.
Assistant Examiner—Michael Dietrich
Attorney, Agent, or Firm—Sughrue, Mion, Zinn Macpeak & Seas, PLLC

[57] ABSTRACT

In a semiconductor device, a lead frame includes normal leads terminating before an edge of a semiconductor chip and LOC leads extending over the semiconductor chip. The semiconductor chip is fixed to the lead frame by adhering the semiconductor chip to stitch sections of the LOC leads through an adhesive tape. A power supply pin and a ground pin are formed of LOC leads having a plurality of stitch sections, which are connected to a plurality of corresponding bonding pads, respectively, through bonding wires. On the other hand, signal pins are formed of normal leads which are connected to corresponding bonding pads through bonding wires, respectively.

8 Claims, 5 Drawing Sheets

CHIP-LEAD INTERCONNECTION STRUCTURE IN A SEMICONDUCTOR DEVICE

BACKGROUND OF THE INVENTION

1. Field of the Invention

The present invention relates to a semiconductor device, and more specifically to a chip-lead interconnection structure in a semiconductor device.

2. Description of Related Art

Referring to FIG. 1, there is shown a diagrammatic plan view illustrating a lead frame and a semiconductor chip in one example of the prior art semiconductor device (called a "first prior art" hereinafter) having an island die-bonded to a semiconductor chip. This first prior art semiconductor device includes a semiconductor chip 1 die-bonded on an island 11 of a lead frame. Each of bonding pads 2 formed on a periphery of the chip 1 is connected to an upper surface of a corresponding lead 6 of the lead frame by a bonding wire 3.

In the first prior art semiconductor device, since each lead cannot extend beyond a line defined by inner tip ends of the other leads, and since each lead cannot extend into a space between the inner tip end of another lead and the semiconductor chip, the bonding pads 2 are arranged on the periphery of the semiconductor chip 1 in accordance with a pin connection order standardized for each package. In this specification, the lead (of the lead frame), which does not extend beyond a line defined by inner tip ends of the other leads and which does not extend into a space between the inner tip end of another lead and the semiconductor chip, will be called a "normal lead".

FIG. 2A shows a diagrammatic plan view illustrating a lead frame of a lead-on-chip (simply abbreviated an "LOC") type and a semiconductor chip in another example of the prior art semiconductor device, and FIG. 2B shows a diagrammatic sectional view of the prior art semiconductor device shown in FIG. 2A. In these figures, elements corresponding to those shown in FIG. 1 are given the same Reference Numerals.

In this example, a protection film 9 covering an upper surface of a semiconductor chip 1 is adhered and fixed to a lower surface of LOC leads 4 by an electrically insulating adhesive tape 8 provided to extend over and cross a lower surface of a stitch section 5 of the LOC leads 4. Each of bonding pads 2 formed on a periphery of the chip 1 is connected to an upper surface of the stitch section 5 of a corresponding LOC lead 4 by a bonding wire 3. In a zone 7 of inhibiting location of stitch, openings are formed to penetrate through the protection film 9 covering the semiconductor chip 1 so that the bonding pads 2 and others are exposed in the openings.

In the prior art LOC structure, furthermore, selected LOC leads extends over the semiconductor chip 1, as ground (GND) pins L2 shown in FIG. 2A, and on the other hand, a plurality of power supply pads and a plurality of ground pads are located at different desired positions on the semiconductor chip, so that the selected LOC leads are connected at different positions thereof to the plurality of power supply pads and the plurality of ground pads through different bonding wires, respectively, whereby power supply pins and ground pins of the semiconductor device are emphasized.

Moreover, Japanese Patent Application Pre-examination Publication No. JP-A-6-232328, (the content of which is incorporated by reference in its entirety into this application, and also an English abstract of JP-A-6-232328 is available from the Japanese Patent Office and the content of the English abstract of JP-A-6-232328 is also incorporated by reference in its entirety into this application), discloses another LOC structure semiconductor device (called a "second prior art" hereinafter). As shown in FIG. 1 of JP-A-6-232328, the second prior art includes power supply pads 5a and 5b and signal pads 6 which are arranged on a surface of a semiconductor chip 1 to form a plurality of rows. A lead 2 (of a lead frame) for a first power supply and a lead 3 (of the lead frame) for a second power supply are arranged to extend between the rows of the power supply pads 5a and 5b and the signal pads 6. Leads 4 (of the lead frame) for signal lines are located at respective outsides of the rows of the power supply pads 5a and 5b and the signal pads 6.

In the LOC structure semiconductor device disclosed in JP-A-6-232328, since the power supply pads 5a and 5b and the signal pads 6 are arranged in the plurality of rows on the surface of the semiconductor chip 1 and since the lead 2 (of the lead frame) for the first power supply and the lead 3 (of the lead frame) for the second power supply are arranged to extend between the rows of the power supply pads 5a and 5b and the signal pads 6, the power supply pads 5a and 5b can be connected to the leads 2 and 3 for the first and second power supplies at desired discretionary positions of the leads 2 and 3 for the first and second power supplies, so that a power supply line length in the semiconductor chip 1 from the power supply pads 5a and 5b to circuit elements internally incorporated in the semiconductor chip 1, can be shortened, with the result that an internal power supply line resistance in the semiconductor chip 1 can be reduced. In addition, since a signal line length in the semiconductor chip 1 from the signal pad 6 to a circuit element internally incorporated in the semiconductor chip 1 can be shortened, an input capacitance of a signal input can be reduced, and therefore, a drop of an operation speed of the semiconductor device can be prevented.

In the first prior art semiconductor device mentioned above, since the lead frame is so configured that each lead cannot extend beyond a line defined by tip ends of the other leads and each lead cannot extend into a space between a tip end of another lead and a semiconductor chip, bonding pads must be arranged on the semiconductor chip in accordance with a pin connection order standardized for each package.

In this first prior art, if it was possible to locate a plurality of power supply pads and a plurality of ground pads at different arbitrary positions, it is possible to shorten the wiring length within the semiconductor chip from each of the power supply pad and the ground pad from a corresponding circuit element within the semiconductor chip, thereby to reduce the wiring resistance of the power supply line and the ground line. However, the lead frame of the first prior art does not allow to locate a plurality of power supply pads and a plurality of ground pads because of the reason as mentioned above. Therefore, in order to emphasize the power supply pad and the ground pad, there is only the way of increasing the width of wiring conductor so as to prevent an increase of the wiring resistance of the power supply line and the ground line within the semiconductor chip. But, this way inevitably results in an increased area of the semiconductor chip.

As a countermeasure for overcoming the above mentioned disadvantage, the LOC structure can be adopted as in the second prior art as mentioned above. In this LOC structure, the power supply lead and the ground lead of the lead frame can be caused to extend over the semiconductor chip, so that the power supply lead and the ground lead can be connected at desired positions thereof through bonding wires to a plurality of power supply pads and a plurality of ground pads located at arbitrary positions on the semiconductor chip. As a result, the power supply line length in the semiconductor chip from the power supply and ground pads to circuit elements internally incorporated in the semiconductor chip can be shortened, so that an internal wiring resistance in the semiconductor chip can be reduced, with the result that the power supply pin and the ground pin can be emphasized.

In the second prior art, however, it is necessary to locate the stitch section of leads of all pins on the semiconductor chip. On the other hand, there is a tendency that the number of pins will increase in future because of further microminiaturization of the semiconductor device, increase of the pin number itself and advancement of the multi-function. This tendency causes the following serious disadvantages in the prior art LOC structure.

A first disadvantage is that: With the increased number of pins, the number of stitch sections relatively increases as compared with the semiconductor chip size. Under this circumstance, even when it was attempted to extend the leads of the power supply pin and the ground pin over the semiconductor chip so that the leads of the power supply pin and the ground pin are connected at desired positions thereof through bonding wires to power supply pads and ground pads located at arbitrary positions of the semiconductor chip in order to emphasize the power supply pin and the ground pins, all of the stitch sections cannot be carried on the semiconductor chip, with the result that some of the stitch sections must be crowded out of the surface of the semiconductor chip. In this condition, it is no longer possible to assemble in the LOC structure, and therefore, it is becomes resultantly impossible to emphasize the power supply pin and the ground pin.

A second disadvantage is that: In the prior art LOC structure, it is necessary to locate, on the semiconductor chip, all leads including not only the power supply lead and the ground lead but also the signal leads. On the other hand, for a high speed access, the signal leads are essentially desired to be at a low resistance and at a low capacitance. However, if the signal lead is extended to have an elongated lead length, an extra inductance, and an extra capacitance and an extra resistance are added to the signal lead, with the result that a delay time between the signal pin and the signal pad increases.

A third disadvantage is that: In the prior art LOC structure, all the LOC leads extend beyond the periphery of the semiconductor chip onto the semiconductor chip by passing between the bonding pads. Therefore, the increase of the LOC leads means the increase of the LOC leads passing between the bonding pads, and accordingly, the pitch of the bonding pads is limited by the number of the LOC leads passing between the bonding pads. Although it is possible to technically reduce the pitch of the bonding pads in a design of the semiconductor device, the location of the bonding pads is restricted by the number of the LOC leads passing between the bonding pads, with the result that the degree of freedom in a layout design is restricted, and the semiconductor chip size is inevitably increased.

SUMMARY OF THE INVENTION

Accordingly, it is an object of the present invention to provide a chip-lead interconnection structure in a semiconductor device which has overcome the above mentioned defects of the conventional ones.

Another object of the present invention is to provide a chip-lead interconnection structure in a semiconductor device, capable of emphasizing the power supply pin and the ground pin, and minimizing the extra inductance, the parasite capacitance and the resistance of signal pins, while avoiding the increase of the semiconductor chip size.

The above and other objects of the present invention are achieved in accordance with the present invention by selectively constituting pins of a semiconductor device by either LOC leads or normal leads in accordance with a use purpose of respective leads, so that the number of stitch sections located on a semiconductor chip can be reduced. As a result, it is possible to permit the increase of the stitch sections caused by freely extending the LOC leads of a power supply pin and a ground pin, and on the other hand, a plurality of power supply pads and a plurality of ground pads can be located at arbitrary positions on the semiconductor chip, so that the LOC leads of a power supply pin and a ground pin can be connected at desired positions thereof to the plurality of power supply pads and the plurality of ground pads provided on the semiconductor chip, with the result that the power supply pin and the ground pin can be emphasized while avoiding the increase of the semiconductor chip size. On the other hand, by using the normal lead, in place of the LOC lead, for the signal pin, the necessary lead length can be reduced to a half, so that the extra inductance, the parasite capacitance and the resistance of signal pins can be minimized.

According to the present invention, there is provided a semiconductor device comprising:

a semiconductor chip having a plurality of first bonding pads and a plurality of second bonding pads formed at a peripheral portion thereof;

a plurality of first leads extending toward the semiconductor chip but terminating before an edge of the semiconductor chip, the plurality of first leads being electrically connected to the plurality of first bonding pads through a bonding wire; and a plurality of second leads extending to and over the semiconductor chip, each of the plurality of second leads having at least one stitch section which is insulatively fixed to the semiconductor chip but which is electrically connected to a corresponding one of the plurality of second bonding pads through a bonding wire;

In one embodiment, at least one of the second leads has a plurality of stitch sections which are insulatively fixed to the semiconductor chip but which are electrically connected to a different ones of the plurality of second bonding pads through different bonding wires, respectively.

In another embodiment, at least one of the second leads is branched to have a first inner end which terminates before the edge of the semiconductor chip and which is electrically connected to one of the plurality of first bonding pads through a bonding wire, and a second inner end which extends to and over the semiconductor chip and which has one stitch section insulatively fixed to the semiconductor chip but electrically connected to a corresponding one of the plurality of second bonding pads through a bonding wire.

In one variation, the second leads constitutes pins for a voltage or a current requiring a stable supplying, and the first leads constitutes the remaining pins of the semiconductor device.

In another variation, the second leads constitutes pins for a power supply voltage, a ground voltage and a reference voltage or current, respectively, and the first leads constitutes the remaining pins of the semiconductor device.

In still another variation, the first leads constitutes pins for signals requiring a high speed operation, and the second leads constitutes signal pins other than the pins for the signals requiring the high speed operation.

The above and other objects, features and advantages of the present invention will be apparent from the following description of preferred embodiments of the invention with reference to the accompanying drawings.

DESCRIPTION OF THE PREFERRED EMBODIMENTS

Figure 1:
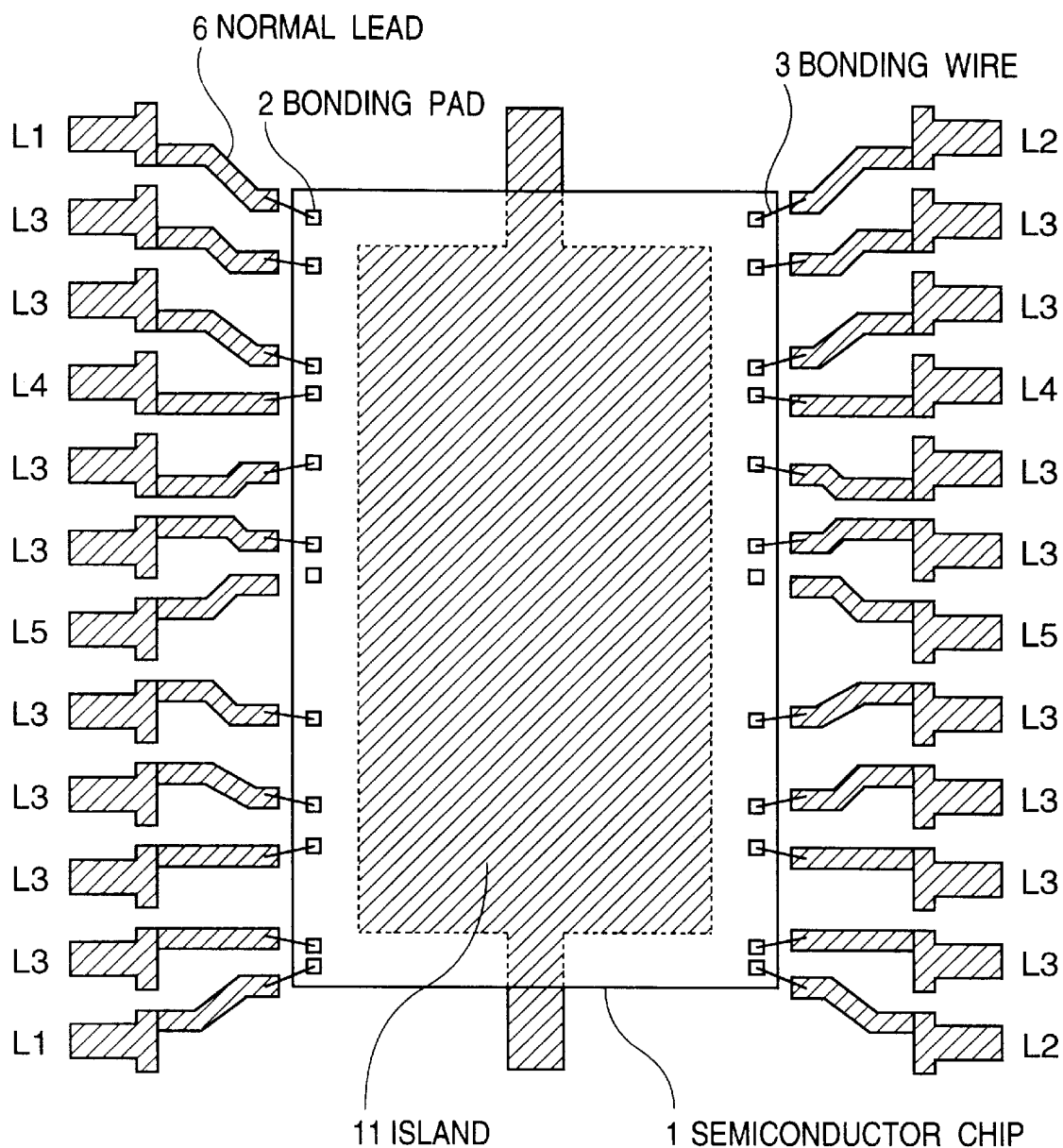
FIG. 1 is a diagrammatic plan view illustrating a lead frame and a semiconductor chip in one example of the prior art semiconductor device.
Figure 2A:
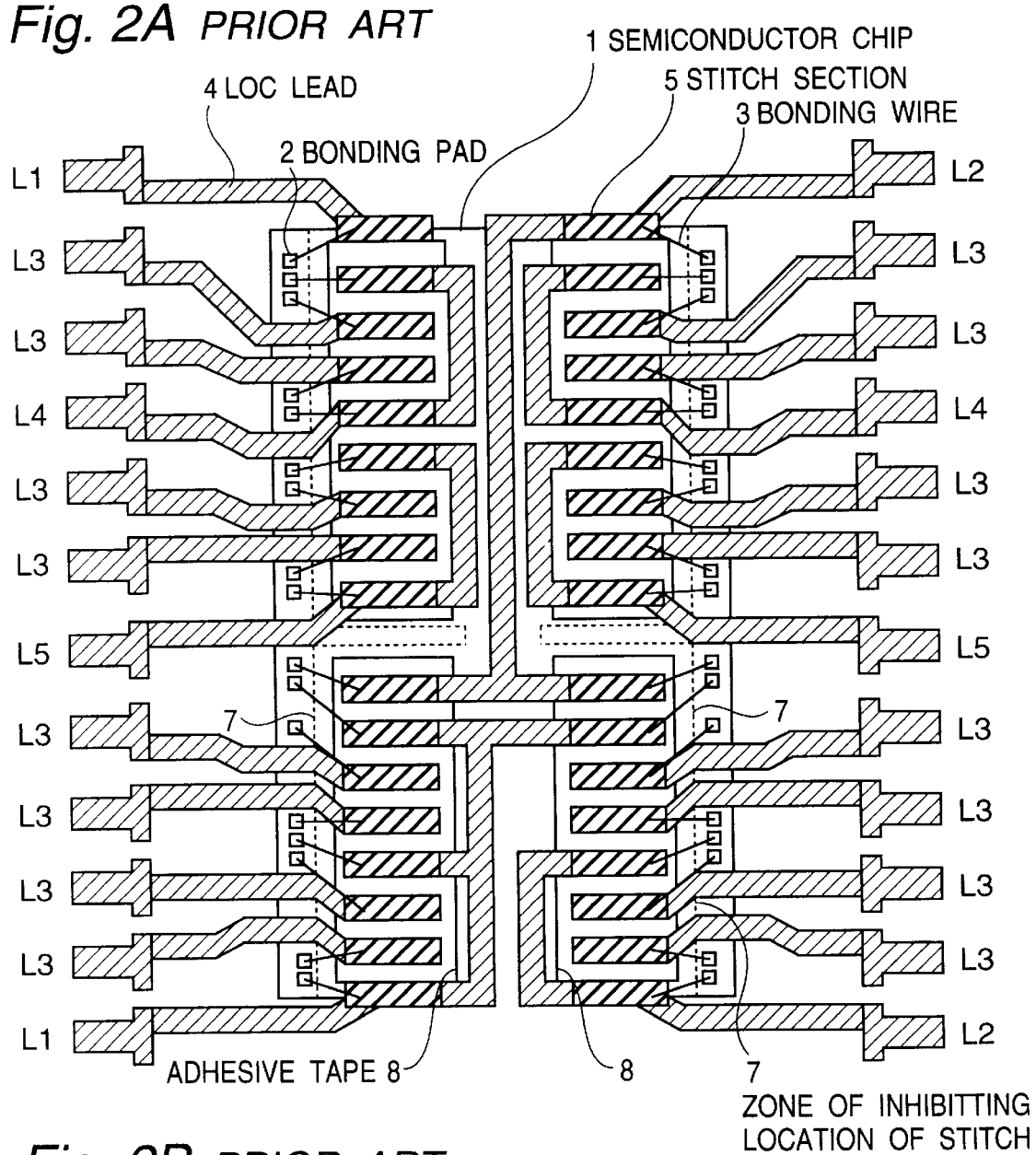
FIG. 2A is a diagrammatic plan view illustrating one example of an LOC type lead frame of and a semiconductor chip in an example of the semiconductor device having an LOC structure.
Figure 2B:
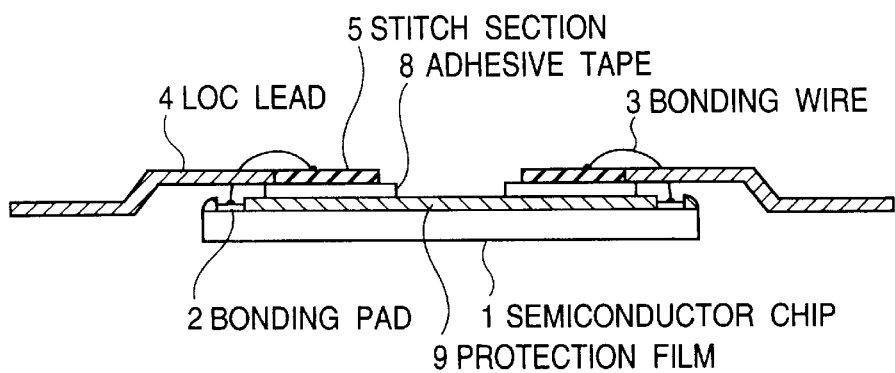
FIG. 2B shows a diagrammatic sectional view of the LOC structure semiconductor device shown in FIG. 2A.
Figure 3A:
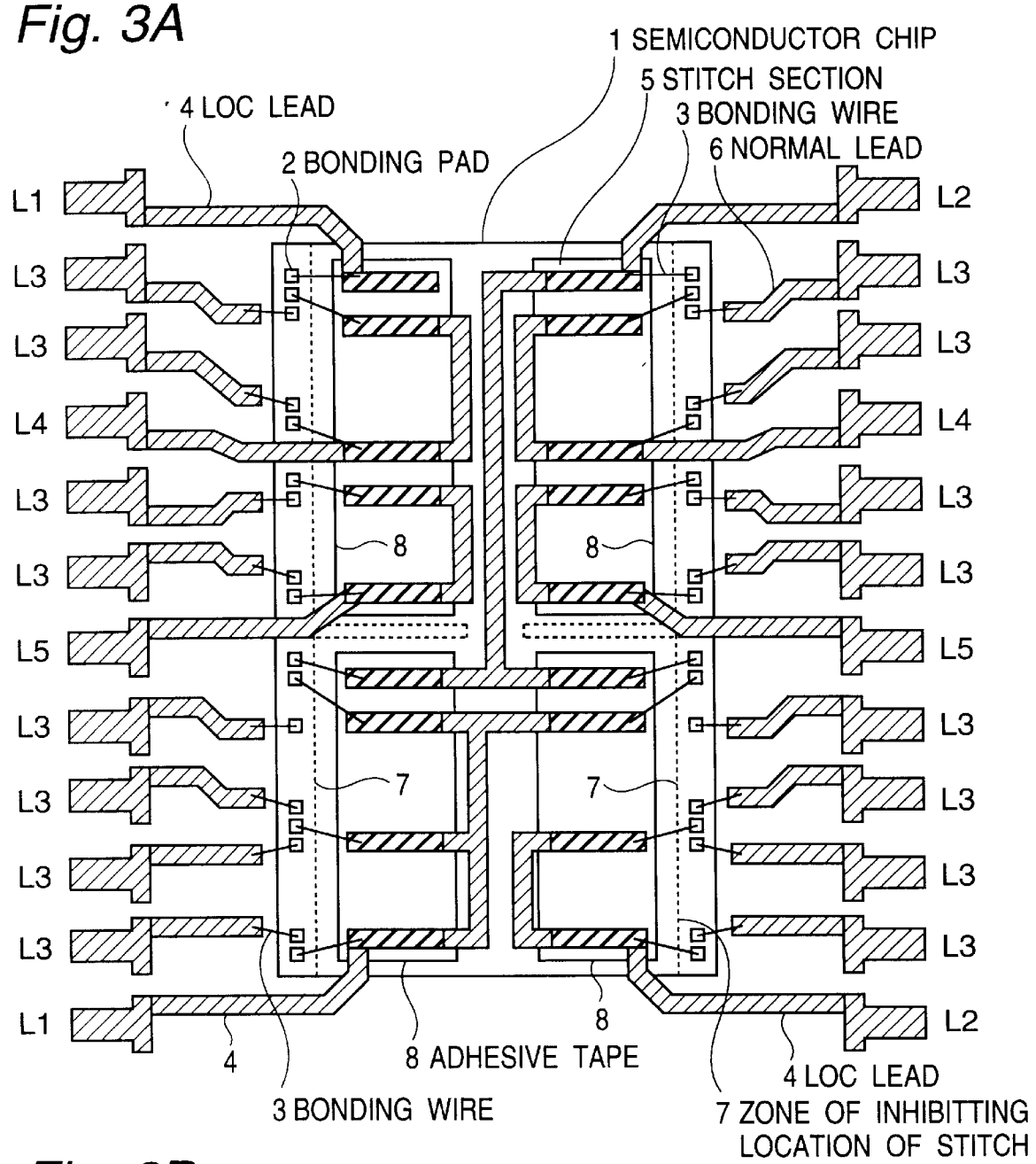
FIG. 3A is a diagrammatic plan view illustrating a lead frame of and a semiconductor chip in a first embodiment of the semiconductor device in accordance with the present invention.
Figure 3B:
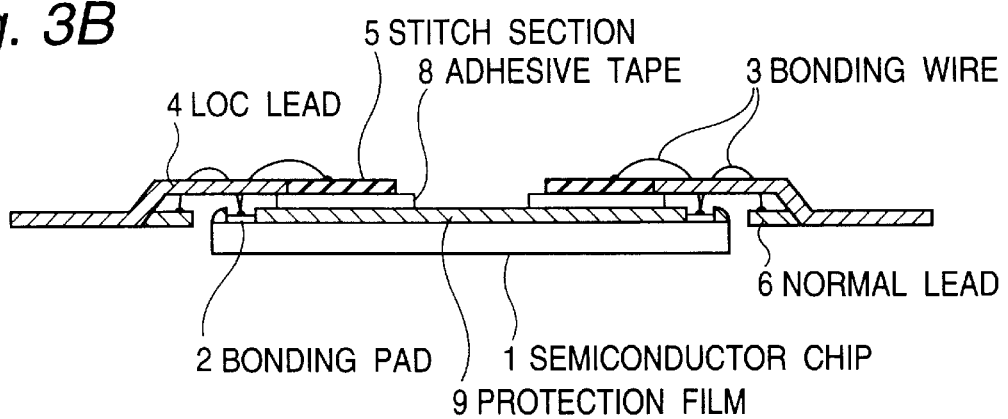
FIG. 3B shows a diagrammatic sectional view of the semiconductor device shown in FIG. 3A.

Referring to FIG. 3A, there is shown a diagrammatic plan view illustrating a lead frame of and a semiconductor chip in a first embodiment of the semiconductor device in accordance with the present invention. FIG. 3B shows a diagrammatic sectional view of the semiconductor device shown in FIG. 3A. In FIGS. 3A and 3B, elements corresponding to those shown in FIGS. 1, 2A and 2B are given the same Reference Numerals.

In this first embodiment, a semiconductor chip 1 has a protection film 9 covering an upper surface of the semiconductor chip 1, and a number of bonding pads 2 located along a pair of opposite long sides of the semiconductor chip 1. In a zone 7 of inhibiting location of stitch, the protection film 9 has openings formed to penetrate through the protection film 9 so that the bonding pads 2 are exposed in the openings.

On the other hand, a lead frame includes two kinds of leads, namely, a plurality of LOC leads 4 and a plurality of normal leads 6. As shown in FIGS. 3A and 3B, the normal leads 6 terminate before an edge of the semiconductor chip 1 with some distance remaining between a tip end of the normal leads 6 and the edge of the semiconductor chip 1, similarly to the lead of the prior art lead frame shown in FIG. 1. On the other hand, the LOC leads 4 extends over the semiconductor chip 1. Each of the LOC leads 4 has at least one stitch section 5 positioned above the semiconductor chip 1, similarly to the LOC lead shown in FIGS. 2A and 2B.

The semiconductor chip 1 is adhered and fixed to a lower surface of the LOC leads 4 by an electrically insulating adhesive tape 8 provided to extend over and cross a lower surface of the stitch sections 5 of the LOC leads 4, similarly to the LOC lead shown in FIGS. 2A and 2B. Some of bonding pads 2 are connected to an upper surface of respective stitch sections 5 of the LOC leads 4 by a bonding wire 3, and the other of bonding pads 2 are connected to an upper surface of a tip end of a corresponding normal leads 6 by a bonding wire 3, More specifically, $V_{CC1}$ pins L1 and GND1 pins L2 are provided for $V_{CC1}$ and GND1, respectively, and are formed of the LOC leads 4 in the shown embodiment. Each of the $V_{CC1}$ pins L1 and the ground pins L2 has a plurality of stitch sections 5 located at arbitrary positions thereof, and these stitch sections 5 are adhered through the adhesive tape 8 to the protection film 9 of the semiconductor chip 1, and each of the stitch sections 5 is connected to a corresponding bonding pad 2 through the bonding wire 3. Similarly, $V_{CC2}$ pins L4 and GND2 pins L5 are provided for $V_{CC2}$ and GND2, respectively, and are formed of the LOC leads 4 in the shown embodiment. Each of the $V_{CC2}$ pins L4 and the GND2 pins L5 has a plurality of stitch sections 5 located at arbitrary positions thereof, and these stitch sections 5 are adhered through the adhesive tape 8 to the protection film 9 of the semiconductor chip 1, and each of the stitch sections 5 is connected to a corresponding bonding pad 2 through the bonding wire 3. On the other hand, signal pins L3 are formed of the normal leads 6, which terminate before the edge of the semiconductor chip 1. A tip end of each of the normal leads 6 is connected to a corresponding bonding pad 2 through the bonding wire 3.

As seen from the above, in this embodiment, the pins of the semiconductor device are selectively constituted of either the LOC lead 4 or the normal lead 6 in accordance with the use purpose of the respective pins, in such a manner that, since it is preferred to supply a stable voltage level to an internal circuit of the semiconductor chips, the power supply pins and the ground pins are formed of the LOC lead 4 extending over the semiconductor chip to have stitch sections 5 which are located at arbitrary desired positions on the semiconductor chip 1 and which are connected to a corresponding bonding pad 2 through the bonding wire 3, so that each of the power supply pins and the ground pins is connected to a plurality of bonding pads, and on the other hand, the signal pins are formed of the normal lead 6 which has no stitch section 5 and terminates before the edge of the semiconductor chip 1, and which is connected to corresponding bonding pad 2 through the bonding wire 3.

Figure 4:
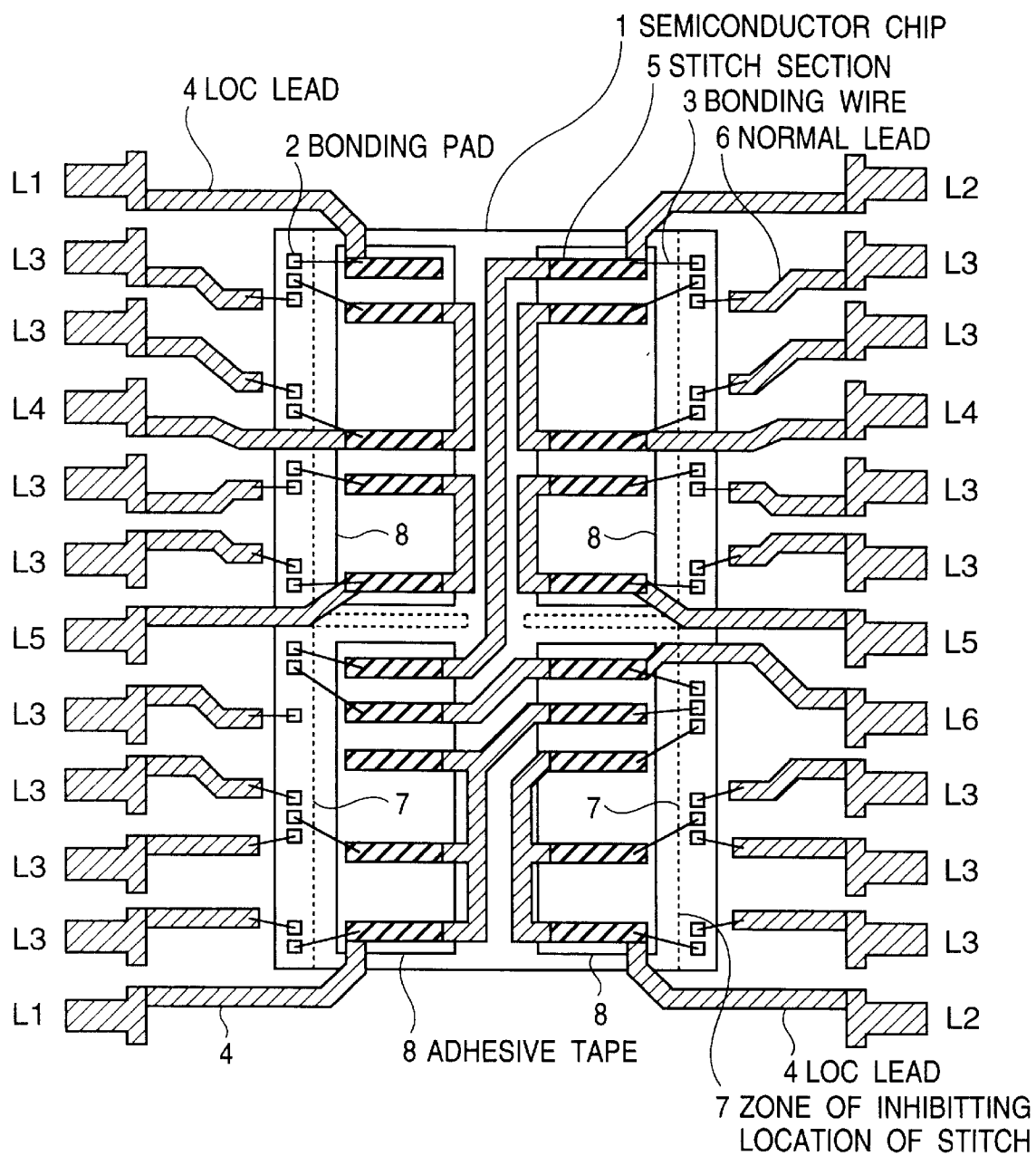
FIG. 4 is a diagrammatic plan view illustrating a lead frame of and a semiconductor chip in a second embodiment of the semiconductor device in accordance with the present invention.

Referring to FIG. 4, there is shown a diagrammatic plan view illustrating a lead frame of and a semiconductor chip in a second embodiment of the semiconductor device in accordance with the present invention. In FIG. 4, elements corresponding to those shown in FIGS. 3A and 3B are given the same Reference Numerals, and explanation thereof will be omitted for simplification of the description.

The second embodiment is different from the first embodiment in that the second embodiment additionally includes a reference voltage supplying pin L6 which is used for discriminating an internal voltage level.

In order to supply a stable voltage level to an internal circuit of the semiconductor chips, it is preferred to locate on the semiconductor chip a plurality of bonding pads 2 for the reference voltage supplying. Therefore, the reference voltage supplying pin L6 is formed of the LOC lead 4 extending over the semiconductor chip to have stitch sections 5 which are located at arbitrary desired positions on the semiconductor chip 1 and which are connected to a corresponding bonding pad of the plurality of bonding pads 2 for the reference voltage supplying, through the bonding wire 3.

Figure 5:
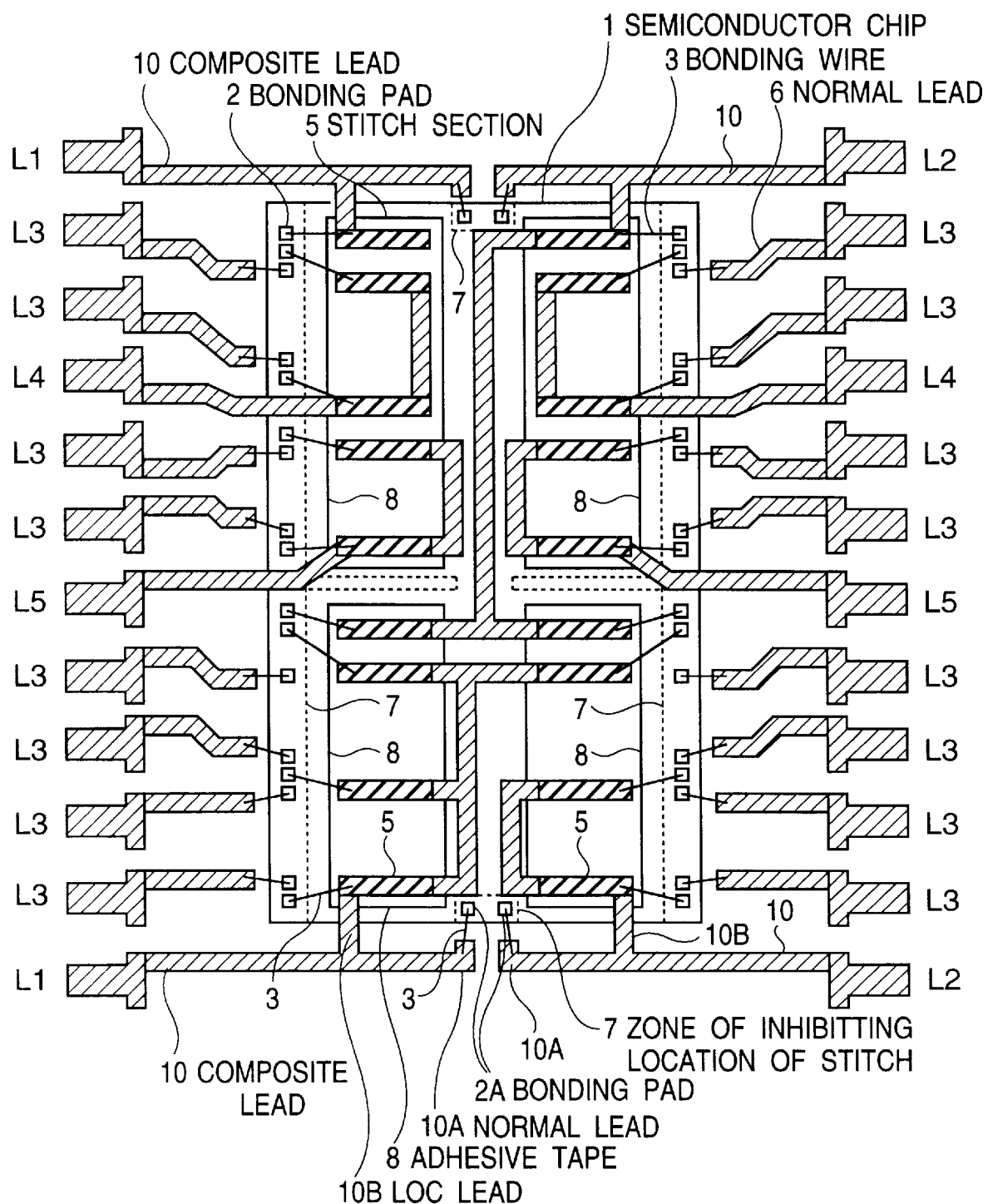
FIG. 5 is a diagrammatic plan view illustrating a lead frame of and a semiconductor chip in a third embodiment of the semiconductor device in accordance with the present invention.

Referring to FIG. 5, there is shown a diagrammatic plan view illustrating a lead frame of and a semiconductor chip in a third embodiment of the semiconductor device in accordance with the present invention. In FIG. 5, elements corresponding to those shown in FIGS. 3A and 3B are given the same Reference Numerals, and explanation thereof will be omitted for simplification of the description.

The third embodiment is different from the first embodiment in that, in the third embodiment, the semiconductor chip 1 additionally includes bonding pads 2A provided at a pair of opposite short sides of the semiconductor chip 1. In order to connect with the bonding pads 2A provided at the short sides of the semiconductor chip 1, the shape of the lead frame can be simplified by wiring-bonding from the normal lead, rather than by providing the stitch section and wiring-bonding from the stitch section. This embodiment is one example of the case of simplifying the lead frame shape. For this purpose, the $V_{CC1}$ pin L1 is formed of a composite lead 10 having a normal lead 10A added to an LOC lead 10B. The LOC lead 10B has a stitch section 5 adhered to the semiconductor chip 1 and connected through a bonding wire 3 to the bonding pad 2, and the normal lead 10A is connected through a bonding wire 3 to the bonding pad 2A. Similarly, the GND1 pin L2 is formed of a composite lead 10 having a normal lead 10A added to an LOC lead 10B. The LOC lead 10B of the GND1 pin L2 has a stitch section 5 adhered to the semiconductor chip 1 and connected through a bonding wire 3 to the bonding pad 2, and the normal lead 10A of the GND1 pin L2 is connected through a bonding wire 3 to the bonding pad 2A.

Thus, according to the present invention, it is possible to supply a voltage or a current requiring a stable supplying, to one of the two kinds of leads (LOC leads), and to supply signals other than the voltage or the current, to the other of the two kinds of leads (normal leads). It is also possible to supply a power supply voltage, a ground voltage and a reference voltage or current to one of the two kinds of leads (LOC leads), and to supply signals other than these voltages and currents, to the other of the two kinds of leads (normal leads). Alternatively, it is also possible to supply a signal requiring a high speed operation to one of the two kinds of leads (normal leads), and to supply the other signals to the other of the two kinds of leads (LOC leads).

As seen from the above, the present invention is characterized in that the signal pins are formed of the normal lead which does not extend over the semiconductor chip, and the power supply pin and the ground pin are formed of the LOC lead which extends over the semiconductor chip, by utilizing an empty space created on the semiconductor chip by forming the signal pins of the normal lead. Thus, the power supply pin and the ground pin can be emphasized.

Furthermore, since the power supply pin and the ground pin can be emphasized, it is possible to increase a wiring current capacity within the semiconductor chip, with the result that noises generating within the semiconductor chip can be reduced, and the wiring length from the power supply pin and the ground pin to the internal circuit of the semiconductor chip can be shortened. In particular, since the signal pin is formed of the normal lead, in place of the LOC lead which is large in the parasite inductance, the parasite capacitance and the resistance, the delay time between the signal pin and the internal circuit of the semiconductor chip can be reduced, so that the delay time in the signal access can be improved.

Moreover, since all of the pins are not formed of only the LOC lead but the signal pins are formed of the normal lead, the number of leads passing between the bonding pads can be reduced, so that the degree of freedom in design can be correspondingly elevated, and the semiconductor chip size can be reduced. Thus, the shape of the lead frame on the semiconductor chip is simplified, and therefore, in a mass production, the lead frame can be formed by an inexpensive press machining, so that the chip cost can be reduced.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising:

a semiconductor chip having a plurality of first bonding pads and a plurality of second bonding pads formed at a peripheral portion thereof;

a plurality of first leads extending toward said semiconductor chip but terminating before an edge of said semiconductor chip, said plurality of first leads being electrically connected to said plurality of first bonding pads through bonding wires; and a plurality of second leads extending to and over said semiconductor chip, each of said plurality of second leads having at least one stitch section which is insulatively fixed to said semiconductor chip and which is electrically connected to a corresponding one of said plurality of second bonding pads through a bonding wire;

wherein at least one of said second leads has a plurality of stitch sections which are insulatively fixed to said semiconductor chip and which are electrically connected to different ones of said plurality of second bonding pads through different bonding wires, respectively; and wherein at least one of said second leads is branched to have a first inner end which terminates before said edge of said semiconductor chip and which is electrically connected to a corresponding one of said plurality of second bonding pads through a bonding wire, and a second inner end which extends to and over said semiconductor chip and which has at least one stitch section insulatively fixed to said semiconductor chip and electrically connected to another corresponding one of said plurality of second bonding pads through a bonding wire.

2. The semiconductor device claimed in claim 1 wherein said second leads constitute pins for one of a stable voltage or a stable current supply, and said first leads constitute the remaining pins of the semiconductor device.

3. The semiconductor device claimed in claim 1 wherein said second leads constitute pins for a power supply voltage, a ground voltage and one of a reference voltage and a reference current, and said first leads constitute the remaining pins of the semiconductor device.

4. The semiconductor device claimed in claim 1 wherein said first leads constitute pins for signals requiring a high speed operation, and said second leads constitute signal pins other than said pins for said signals requiring the high speed operation.

5. A semiconductor device comprising:

a semiconductor chip having a plurality of first bonding pads and a plurality of second bonding pads formed at a peripheral portion thereof;

a plurality of first leads extending toward said semiconductor chip but terminating before an edge of said semiconductor chip, said plurality of first leads being electrically connected to said plurality of first bonding pads through bonding wires;

a plurality of second leads extending to and over said semiconductor chip, each of said plurality of second leads having at least one stitch section which is insulatively fixed to said semiconductor chip and which is electrically connected to a corresponding one of said plurality of second bonding pads through a bonding wire; and wherein at least one of said second leads is branched to have a first inner end which terminates before said edge of said semiconductor chip and which is electrically connected to a corresponding one of said plurality of second bonding pads through a bonding wire, and a second inner end which extends to and over said semiconductor chip and which has at least one stitch section insulatively fixed to said semiconductor chip and electrically connected to another corresponding one of said plurality of second bonding pads through a bonding wire.

6. The semiconductor device claimed in claim 5 wherein said second leads constitute pins for one of a stable voltage or a stable current supply, and said first leads constitute the remaining pins of the semiconductor device.

7. The semiconductor device claimed in claim 5 wherein said second leads constitute pins for a power supply voltage, a ground voltage and one of a reference voltage and a reference current, and said first leads constitute the remaining pins of the semiconductor device.

8. The semiconductor device claimed in claim 5 wherein said first leads constitute pins for signals requiring a high speed operation, and said second leads constitute signal pins other than said pins for said signals requiring the high speed operation.

* * * * *